United States Patent [19]

Khandelwal

[11] 3,894,895

[45] July 15, 1975

[54] MESA ETCHING WITHOUT OVERHANG FOR SEMICONDUCTOR DEVICES

[75] Inventor: Deen D. Khandelwal, Torrance, Calif.

[73] Assignee: TRW Inc., Redondo Beach, Calif.

[22] Filed: Oct. 29, 1973

[21] Appl. No.: 410,661

[52] U.S. Cl. .................... 156/8; 29/578; 117/212; 117/217; 156/17; 357/81

[51] Int. Cl. .................... H01l 7/00

[58] Field of Search ............ 156/11, 17, 7, 8, 13, 3; 29/578, 579, 580, 630 R; 96/36.2; 357/81; 117/212, 217

[56] References Cited

UNITED STATES PATENTS 3,544,401 12/1970 Jarman .................... 29/580

3,823,352 7/1974 Pruniaux et al. .................... 29/579

*Primary Examiner*—Charles E. Van Horn
*Assistant Examiner*—Jerome Massie
*Attorney, Agent, or Firm*—Daniel T. Anderson; Jerry A. Dinardo; Stephen J. Koundakjian

[57] ABSTRACT

Undercutting of silicon under the top metal contact of an IMPATT diode by silicon etch is inhibited by depositing a larger masking dot over the top metal contact. The silicon etch is allowed to undercut the silicon under the larger masking dot while leaving intact the silicon beneath the top metal contact. The larger masking dot is thereafter removed so as to leave a silicon mesa of the same top diameter as the top metal contact resting thereon.

5 Claims, 8 Drawing Figures

MESA ETCHING WITHOUT OVERHANG FOR SEMICONDUCTOR DEVICES

BACKGROUND OF THE INVENTION

This invention relates to the art of fabricating semiconductor devices, and more particularly to that class of high frequency, high power semiconductor diodes known generally as IMPATT diodes.

IMPATT diodes are in the form of a multilayer sandwich of several strata of semiconductor, including a p-n junction, disposed between two electrodes. When operated in an avalanche mode and placed in a resonant circuit, they can be made to generate or amplify microwave oscillations. A more complete discussion of IMPATT diodes, which is an acronym for impact avalanche and transit time, can be found in U.S. Pats. of Read, No. 2,899,652 and of Misawa, No. 3,621,466.

These diodes are very small, being only a few microns in semiconductor layer thickness and tens of microns in diameter. For example, a diode operating at 60 gigahertz would have a semiconductor thickness of less than 10 microns and a diameter of about 40 microns. For this reason they can be mass produced by photolithographic masking and etching techniques with several hundred being thus produced from a single semiconductor wafer only an inch or so in diameter.

In the manufacturing process, the top electrodes are patterned as dots on the semiconductor comprising the several strata, and the electrode dot provides an etching mask pattern for the semiconductor etching process. In the etching process, the acid etchant dissolves away the semiconductor in the spaces between the top electrode pattern, while the semiconductor beneath the electrode pattern is less subject to attack by the etchant.

Unavoidably, some of the semiconductor beneath the electrode mask does dissolve, and this gives rise to an effect known as undercutting. Accordingly, when the semiconductor has been etched through its full thickness, each semiconductor element resembles a miniature mesa having a top electrode which overhangs the mesa. In other words, the diameter of the top electrode is greater than the top diameter of the semiconductor mesa, and the difference between the two radii is equal to the overhang.

The amount of overhang is usually quite severe and depending upon the parameters of the etching process, its value falls within a range of about 50% to 120% of the thickness of the semiconductor mesa, and usually is about 75% of that thickness. For such a high degree of overhang to exist in the diode when it is operating in the field is quite undesirable, since the overhanging material may fall around the semiconductor junction in the lower outside region of the mesa and short circuit the junction. The effect of excessive overhang is that the reliability of the device is degraded. Some means of removing or preventing the formation of the overhang would prove highly desirable.

SUMMARY OF THE INVENTION

An additional masking dot is applied over the top metal electrode dot. The additional masking dot has a larger diameter than the top electrode dot and lies concentric therewith so as to extend over an annular ring of semiconductor not covered by the top electrode dot. The diameter of the larger dot exceeds that of the top electrode dot by an amount equal to twice the normal amount of undercutting that usually occurs beneath the electrode dot. Stated differently, the difference between the radii of the two dots is equal to one undercutting dimension.

When the semiconductor is etched around the larger dot, the semiconductor undercutting is allowed under the larger dot up to the periphery of the smaller electrode dot, but semiconductor under the smaller electrode dot is not etched. Thereafter, the larger masking dot is removed to leave the top electrode dot resting on a semiconductor mesa of the same diameter as the top electrode dot.

DESCRIPTION OF THE PREFERRED EMBODIMENT

Figure 1:
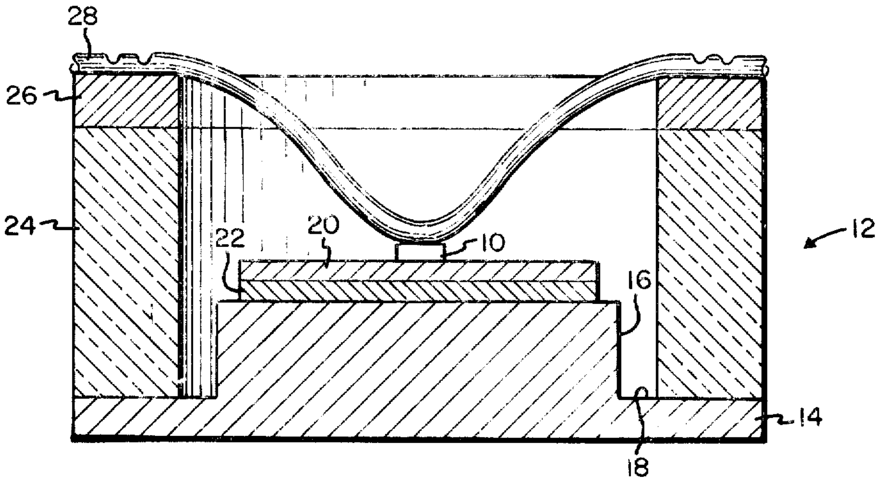
FIG. 1 is a greatly enlarged sectional view of a packaged IMPATT diode, drawn not to scale.

Referring now to FIG. 1, there is shown a greatly enlarged sectional view of a packaged IMPATT diode 10. The diode package, which is designated generally by the numeral 12, is cylindrical in form and includes a pedestal 14 having a relatively thick central portion 16 and a thinner peripheral land portion 18. The pedestal 14 serves as a heat sink and also as one of the terminals of the diode, and therefore is made of cooper or any other suitable heat dissipative metal.

The diode 10 is supported on the top surface of the central portion 16 by a heat sink disk 20 that is plated onto the bottom metal contact, not shown, of the diode 10. The heat sink disk 20 is bonded to the top surface of the central portion 16 of the pedestal 14 by a layer of solder 22.

A cylindrical ceramic spacer member 24 is joined to the land portion 18 of the pedestal 14, as by brazing or the like. A metal ring 26 sealed to the top of the spacer member 24 serves as the other terminal of the diode 10. A bond wire 28 of gold or the like serves as a lead-in for connecting the diode 10 to the metal ring 26. The two ends of the bond wire 28 are welded to the metal ring 26 at two diametrically opposed points thereof, and the middle of the wire 28 is welded to the top metal contact, not shown, of the diode 10.

Figure 2:
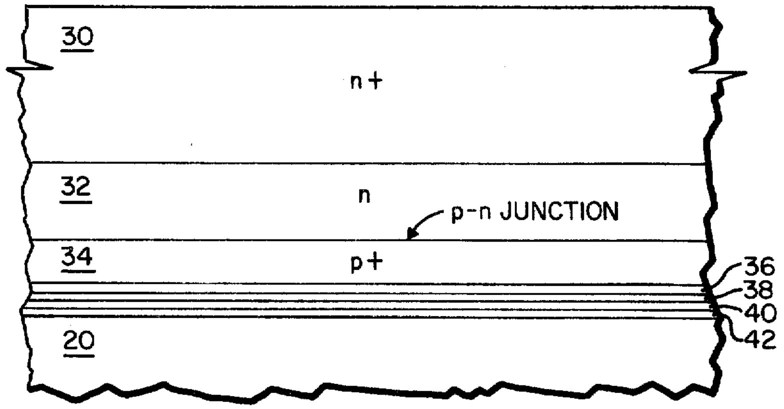
FIGS. 2 through 8 are greatly enlarged sectional views showing an IMPATT diode at various stages of its manufacture, all drawn not to scale.
Figure 3:
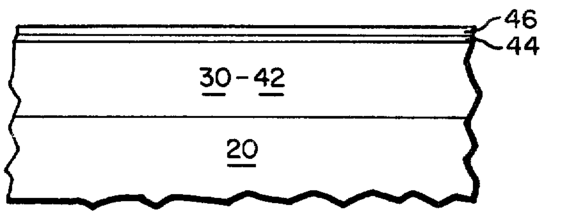

Referring now to FIGS. 2–8 there will be described a step by step process of fabricating IMPATT diodes such as the diode 10 of FIG. 1, according to the invention. While it is understood that in practice a multiplicity of diodes are manufactured simultaneously on a single semiconductor chip, for ease in description only one diode will be shown and described. Furthermore, while silicon is chosen as the semiconductor for this embodiment, it is understood that this invention is applicable to devices made with other semiconductors. In FIG. 2 there is shown a portion of a layered structure of silicon which includes an *n*+ layer or substrate 30, an *n* layer 32, and a *p*+ layer 34. These layers can be formed by such techniques as epitaxial growth, diffusion, ion implantation, or a suitable combination thereof. The junction between the *n* layer 32 and the p+ layer 34 constitutes the *p-n* junction of the diode.

The bottom ohmic contact for the diode is preferably formed by vacuum sputtering platinum onto the $p+$ layer 34 to form a layer 36 of platinum silicide; then vacuum sputtering titanium and tungsten simultaneously to form a composite alloy layer 38 of those two elements; and then vacuum sputtering a bulk contact layer 40 of gold. The titanium: tungsten alloy layer 38 serves as a diffusion barrier for the gold contact metal, and the platinum silicide serves as an intermediate bonding agent between the silicon and the titanium: tungsten alloy layer 38.

A heat sink is next applied to the bottom contact by first electroplating a layer 42 of nickel on the gold layer 40 and then electroplating copper on the nickel layer 42 to form the heat sink disk 20, also shown in FIG. 1. The nickel layer 42 forms a diffusion barrier between the gold layer 40 and the copper heat sink disk 20. A metal other than copper may be used for the heat sink, such as gold or silver.

After the heat sink disc 20 is plated onto the back contact, the $n+$ layer 30 is thinned down from its relatively larger original dimension to a final dimension that is proper for the particular microwave frequency of operation for the diode. Typical dimensions for the layered structure thus far described are as follows for a diode operating at a frequency of 60 gigahertz.

| | |
|---|---|
| Layer 30 | 9 microns |
| Layer 32 | .5 micron |
| Layer 34 | .3 micron |
| Layer 36 | 800 A |
| Layer 38 | 400 A |
| Layer 40 | 2000 A |
| Layer 42 | 50 A |

Now the device is ready for application of the top contact and etching of the silicon mesa according to the invention. The top metal contact may comprise a suitable combination of a number of metals such as gold, chromium, titanium, palladium, or other suitable metals which will meet the basic requirements for the contact metal system. For this example, the metallization is described as including a layer of chromium and a layer of gold. Thus, in FIG. 3, a chromium layer 44 and a gold layer 46 are deposited in that order on the silicon $n+$ layer 30 by evaporation in vacuum. The chromium layer 44 provides good ohmic contact and adherence to the silicon. The gold layer 46 provides a nonoxidizing surface for bonding purposes.

Figure 4:
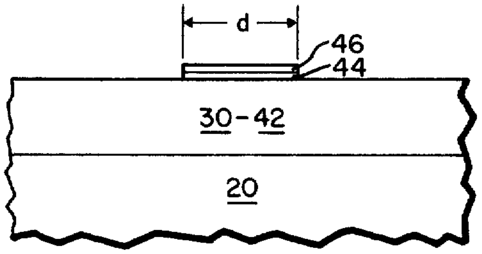

Then, by photolithographic techniques, including photoresist masking and acid etching, a first metal dot of desired diameter $d$ is defined and formed in the layers 44, 46 as shown in FIG. 4. For the 60 gigahertz diode the diameter $d$ is about 40 microns. Now, if one were to proceed according to the prior art, the silicon layer would be subjected to an acid etching process in which the metal dot layers 44, 46 serve as an etching mask. The etching process would remove not only the silicon left uncovered by the metal dot but also would remove silicon from beneath a substantial peripheral region of the metal dot. This is known as undercutting the silicon under the metal dot.

According to the invention, however, undercutting of the silicon under the metal dot layers 44, 46 is inhibited by first covering the dot layers 44, 46 with an additional masking dot of larger diameter than the first dot layers 44, 46 prior to etching the silicon. Then when the silicon is etched, the silicon under the larger masking dot is allowed to be undercut without undercutting the silicon under the first metal dot layers 44, 46.

Figure 5:
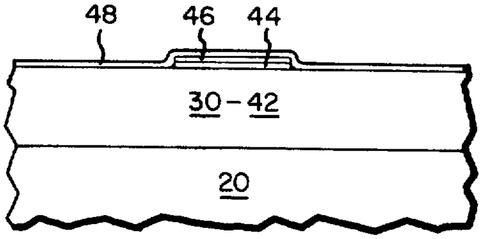

To provide the masking dot, an additional layer 48 of chromium may be deposited by evaporation in vacuum on the silicon $n+$ layer 30 covering the layers 44 and 46 of dot diameter $d$, as shown in FIG. 5. Typically the layer 48 may be 1,000 A of chromium. Alternatively, the layer 48 may comprise 200 A of chromium followed by 2,000 A of gold, for example.

Figure 6:
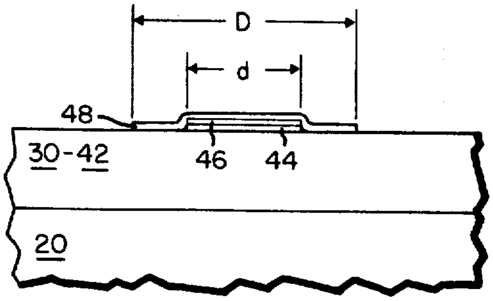

Now, using photoresist masking and acid etching techniques, portions of the layer 48 are removed, as shown in FIG. 6, to define a second dot of larger diameter D, that concentrically overlies the first dot of small diameter $d$ defining the metal contact layers 44, 46. The larger dot layer 48 will serve as a mask to prevent undercutting of the silicon lying beneath the smaller dot layers 44, 46 when the structure is subjected next to the silicon etch process.

Figure 7:
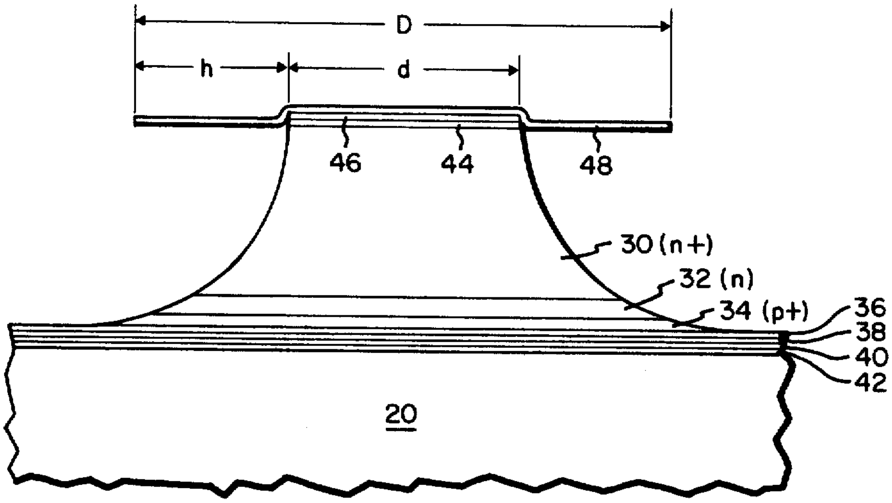

Referring to FIG. 7, the silicon is etched with an appropriate etchant, which, for example, may comprise a combination of hydrofluoric, nitric, and acetic acids. The silicon is etched through the entire depth thereof down to the first layer 36 of the bottom contact metal. As the silicon is etched in depth it is also etched radially inward, thereby undercutting the silicon under the larger metal dot layer 48 to form a silicon mesa structure. The silicon is etched radially inwardly until the periphery of the smaller dot layers 44, 46 is reached and the larger metal dot layer 48 is left overhanging the top of the silicon mesa. The metal overhang extends between the two circumferences of the dot layers 44, 46 and dot layer 48 so that no undercutting of the silicon under the smaller dot layers 44, 46 occurs.

In practice, it has been found that the amount of silicon undercutting that normally occurs beneath a metal dot is in the range of 50% to 120% of the thickness of the silicon. Thus, the overhang dimension $h$ in FIG. 7, which is ½ the difference between the diameters D and $d$, is chosen to be equal to the normal amount of silicon undercutting that occurs in the silicon etching process. If t is the thickness of the silicon, then $D - d = 2h = 2nt$, where $n$ is in the range of 0.5 to 1.2, and nominally is about 0.75.

Figure 8:
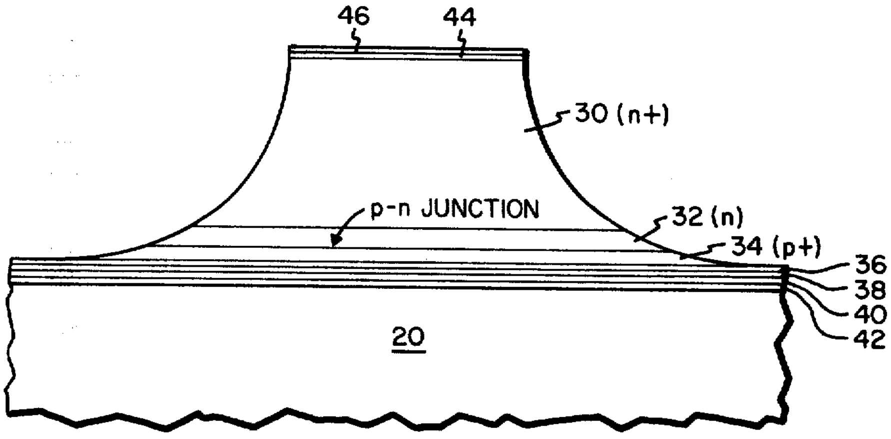

Following the silicon etch, the chromium dot layer 48 is removed by etching, as shown in FIG. 8, to leave the top metal contact layers 44, 46 of small diameter $d$ resting on a silicon mesa whose top diameter is also equal to small diameter $d$. Since there is no excess of the metal contact overhanging the silicon mesa, there is no longer any danger of the top metal contact short circuiting the p-n junction between layers 32 and 34 below.

The cylindrical boundary of the individual diode heat sinks is then defined by applying photolithographic processing to the back surface of the copper heat sink disk 20 so as to etch away the metal of the heat sink disk 20 and the metal layers 42, 40, 38, 36 that lies outside the predetermined cylindrical boundary.

The actual choice of materials for the metal layers 44 and 46, masking layer 48, and any additional layers will vary depending upon the type of semiconductor used in the fabrication of the device, and upon the experience and knowledge of those familiar with the art of semiconductor device processing. One of the essential requirements is that the material in the top masking layer 48 is not chemically affected by the semiconductor etch. Another requirement for the choice of the top masking layer material is that it be etchable by an etchant that will not affect the semiconductor or the other materials of the packaged device. Thus, while it may be convenient to deposit the masking dot layer 48 from the same material or materials used for the small metal dot layers 44 and 46 comprising the top contact, it will be understood that other materials, not necessarily metallic, that meet the chemical processing requirements can be used. Among such alternative materials is the class of photoresist materials that are commonly used in semiconductor device processing.

What is claimed is:

1. A method of fabricating a mesa-type semiconductor device, comprising:

A. coating a conductive layer on a first surface of a semiconductor wafer of given thickness;

B. forming a metallic contact of given surface extent and comprising at least one layer of metal on a second surface parallel to said first surface of said wafer;

C. applying a masking layer over said metallic contact so as to cover said contact completely and also cover the surface of said wafer surrounding said contact with a contiguous annular ring of said masking layer having a width equal to the amount of undercutting of said wafer that results from etching through its thickness;

D. etching said wafer through the entire thickness thereof with an etchant that does not attack either said masking layer or said metallic contact so as to remove wafer material beneath said annular ring while leaving intact a mesa of wafer material beneath said metallic contact and coextensive therewith; and E. chemically removing said masking layer so that said metallic contact remains affixed to said second surface of said semiconductor mesa without causing any undercutting of said wafer beneath said metallic contact and without causing any significant reduction in the original size of said metallic contact.

2. The invention according to claim 1, wherein the width of the annular ring of said masking layer recited in clause (C) is in the range of 50 to 120% of the thickness of said wafer.

3. The invention according to claim 2, wherein said masking layer and said metallic contact are concentrically circular.

4. The invention according to claim 3, wherein the diameter of said masking layer exceeds that of said metallic contact by a value equal to about 1.5 times the thickness of said wafer.

5. The invention according to claim 1, wherein said metallic contact is formed by depositing a layer of chromium on said second surface of said semiconductor wafer and a layer of gold on said chromium layer, and said masking layer is formed by depositing a layer of chromium over said metallic contact.

* * * * *